United States Patent [19]
Anderle et al.

[11] Patent Number: 5,275,709
[45] Date of Patent: Jan. 4, 1994

[54] APPARATUS FOR COATING SUBSTRATES, PREFERABLY FLAT, MORE OR LESS PLATE-LIKE SUBSTRATES

[75] Inventors: Friedrich Anderle, Hanau; Ulrich Patz, Linsengericht, both of Fed. Rep. of Germany

[73] Assignee: Leybold Aktiengesellschaft, Hanau, Fed. Rep. of Germany

[21] Appl. No.: 863,953

[22] Filed: Apr. 6, 1992

[30] Foreign Application Priority Data

Nov. 7, 1991 [DE] Fed. Rep. of Germany ... 913860[U]

[51] Int. Cl.$^5$ .............................................. C23C 14/34
[52] U.S. Cl. ........................... 204/298.25; 204/298.35; 118/719; 414/217
[58] Field of Search ...................... 204/298.25, 298.26, 204/298.35; 156/345; 118/718, 719, 723; 414/217

[56] References Cited

U.S. PATENT DOCUMENTS 4,550,239 10/1985 Uehara et al. .................. 414/217 X
4,825,808  5/1989 Takahashi et al. ......... 204/298.25 X

FOREIGN PATENT DOCUMENTS 0440259 8/1991 European Pat. Off. .
0041470 3/1984 Japan .............................. 204/298.25
2171119 8/1986 United Kingdom .

*Primary Examiner*—Nam Nguyen
*Attorney, Agent, or Firm*—Felfe & Lynch

[57] ABSTRACT

Apparatus for coating substrates by a vacuum coating process. The apparatus includes a plurality of closed processing chambers, each provided with an entrance/exit closable opening. The individual processing chambers have an approximately equal configuration in groups and are disposed one above the other. The chambers have planes in each case at the same distance from a level on which the apparatus is set up. The individual chambers have entrance/exit closable openings. A common elevator chamber has a substrate lift by which the substrates can be moved vertically from the plane of one processing chamber to the plane of another processing chamber. The entrance/exit closable openings lead all to the common elevator chamber. At least one of the chambers of a group has an entrance/exit airlock chamber and is provided with an entrance/exit airlock opening which forms a connection to space surrounding the apparatus.

2 Claims, 2 Drawing Sheets

APPARATUS FOR COATING SUBSTRATES, PREFERABLY FLAT, MORE OR LESS PLATE-LIKE SUBSTRATES

BACKGROUND OF THE INVENTION

The invention relates to an apparatus for coating substrates, preferably flat, more or less plate-like substrates—especially curved glass plates—by means of a vacuum coating process, the apparatus being equipped with a plurality of closed processing chambers each provided with an entrance and exit closable opening.

It is known in apparatus for coating substrates by vacuum coating processes, especially sputtering processes, to provide a plurality of individual processing chambers which are arranged in line one behind the other, so that the substrate held by a substrate carrier can be advanced from one chamber to the next and thus can be fed to different processes (EP 0 440 259). The known apparatus has the disadvantage that such a system, with chambers disposed next to one another (a so-called "in-line" system) requires a relatively great amount of space and needs a comparatively great floor space and clean-room area. There is the added difficulty that, in order to separate the chambers cleanly with buffer chambers, additional vacuum chambers are needed which further increase the cost and enlarge the apparatus.

It is an object of the present invention to create an especially compact apparatus which, with a minimum of chambers, permits multi-layer coating of high quality. Furthermore, the apparatus must be comparatively inexpensive to manufacture, i.e., it is to be made with a minimum of chamber wall surfaces.

SUMMARY OF THE INVENTION

This object is achieved according to the invention in that the individual processing chambers have approximately the same configuration and are arranged in groups and one above the other, their chamber levels being each situated at the same distance from the level on which the apparatus is set up and its entrance and exit closable openings leading all into a common elevator chamber which is equipped with a substrate lift whereby the substrates can be carried from the level of one processing chamber to the level of another processing chamber, and at least one of the chambers of a group is provided as a loading chamber or entrance and exit airlock chamber with a second entrance and exit airlock opening which forms the connection to the space surrounding the apparatus.

BRIEF DESCRIPTION OF THE DRAWING

The invention admits of a great variety of embodiments; one of them is represented in the appended drawings wherein.

DESCRIPTION OF A PREFERRED EMBODIMENT

Figure 1:
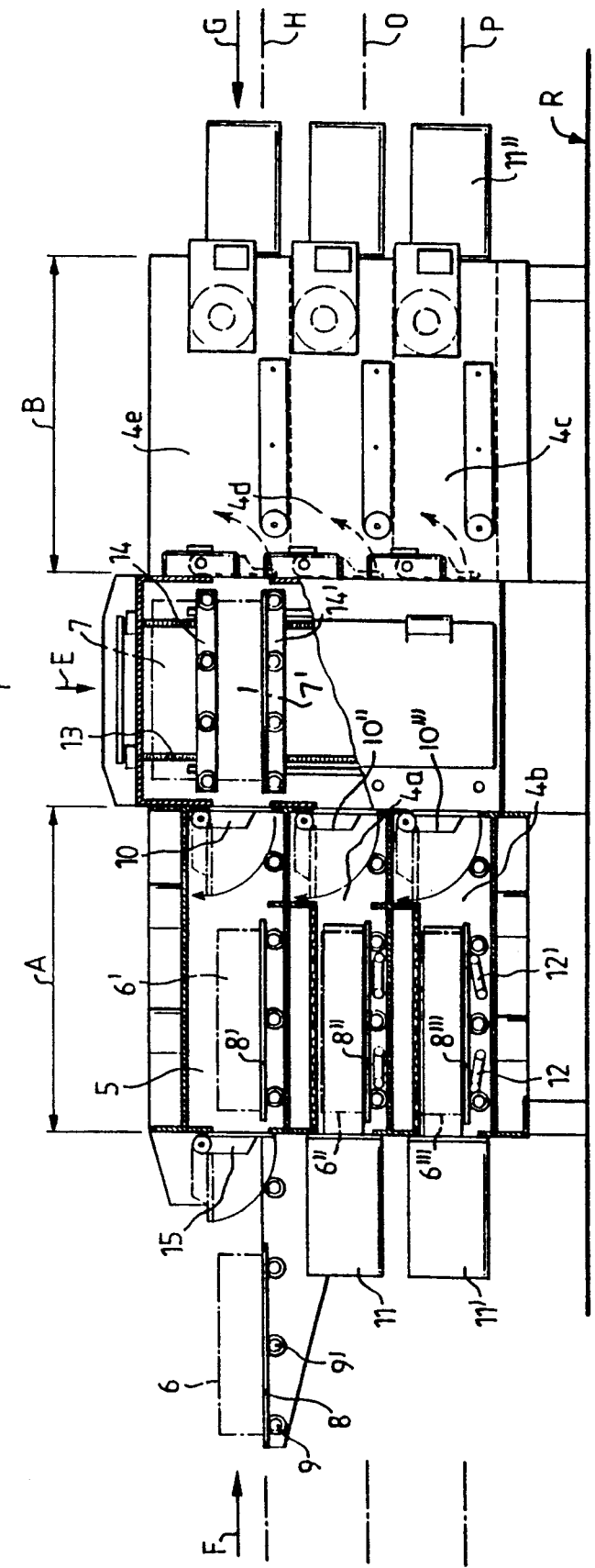
FIG. 1 is a partial longitudinal sectional view of an apparatus in accordance with the invention.
Figure 2:
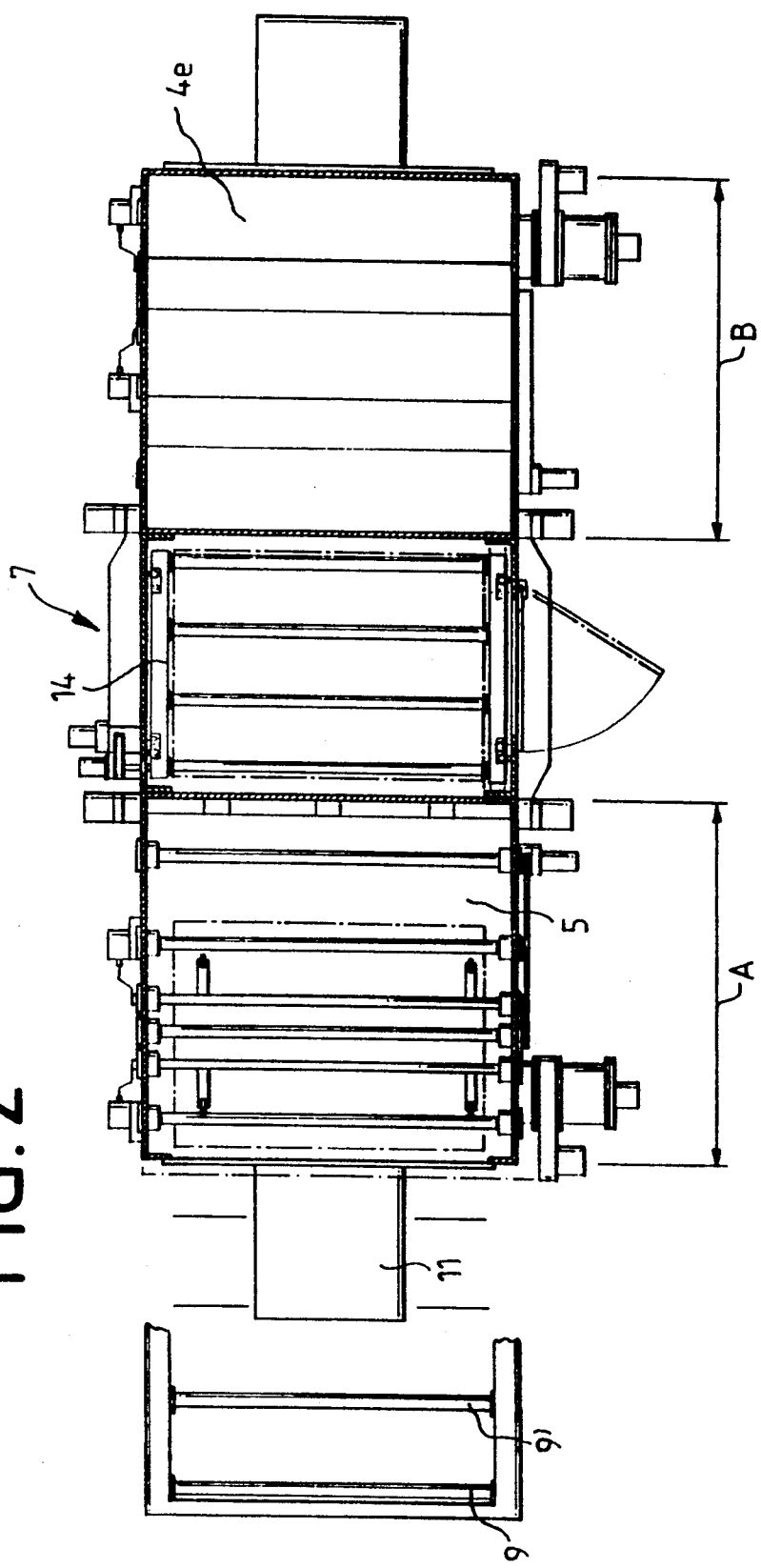
FIG. 2 is a partial top sectional view of the FIG. 1 apparatus.

The coating apparatus represented in the drawings is designed as an airlock apparatus for coating curved glass sheets with amorphous silicon. The coating is performed by a static, plasma-supported CVD process. The coating here consists of a sandwich of three layers differing from one another in their doping.

For reasons of purity, the coatings are produced in separate processing chambers 4a to 4e, which are provided in two groups A and B one over the other, an additional chamber 5 being provided in group A, which serves for letting the substrates 6, 6', . . . , enter through a closable opening 10 into the lift chamber 7 and which is provided at both its outer extremity with an airlock valve 15.

The substrates 6, 6', 6'', . . . , are each placed on pallet-like substrate holders 8, 8', . . . , and move in the desired direction by means of motor-driven wheels 9, 9', . . . .

While the entrance airlock chamber 5 is provided with a closable opening 10 and an airlock 15, the process chambers 4a to 4e have only one closable opening each, 10, 10'', 10''', . . . , these closable openings all permitting only access from an elevator chamber 7 to the particular processing chamber 4a, 4b, . . . the entrance/exit closable openings (10, 10''. . . ) of all processing chambers are provided facing one another. The positions of the hinged covers are indicated by curved arrows and broken-line construction.

To each of the processing chambers 4a, . . . , there is connected a coating system 11, 11', . . . , these being operated from the outside. Furthermore, the processing chambers 4a, . . . , and the entrance airlock chamber 5, and also the elevator chamber 7, are connected to vacuum pumps, but this is not shown for the sake of ease of comprehension.

To enable the correct distance between substrate 6, 6', . . . , and the coating source (not shown) to be established, each of the processing chambers 4a, . . . , is also equipped with a substrate lifting means 12, 12', . . . , i.e., with pairs of lifting arms pivoted on the floor of the particular processing chamber, by means of which the substrates 6, 6', . . . , can be raised when in the coating position in the processing chamber.

With the elevator 13 the substrates 6, 6', . . . , together with their associated substrate holders 8, 8' . . . , can be moved vertically (in the directions of arrows D and E) e.g. from position 7' to an upper "park" position above holding frame 14. Since the holding frames 14, 14', . . . , of the elevator are also provided with wheels 9, . . . , the substrate 6, 6', . . . , can be moved horizontally (directions of arrows F and G) after reaching the desired position with respect to the level of the chamber.

The special advantage of the system represented in the drawings is that the substrates 6, 6', . . . , can be made to enter and leave the processing chambers 4a, 4b, . . . , cyclically and simultaneously through the closable openings, in such a manner that each substrate can be advanced in sequence from the first processing chamber 4a to the next 4b, etc., and, after passing through all of the processing chambers 4a to 4e, it can exit from the apparatus through the air airlock 15 at chamber 5, or, at the beginning of the process it can enter the apparatus through an airlock 15, without the need to let air into the processing chambers between the steps.

Another advantage of the apparatus represented is that in the second and in the third processing chambers 4b, 4c, for example, the same kind of coating can be applied, while in processing chambers one, four and five (=4a, 4d, 4e) different kinds of coatings can be produced at the same time; in this case the second coat on the substrate 6, 6', . . . , would in each case have a double thickness (with respect to the other three coats).

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. Apparatus for coating substrates, by a vacuum coating process, the apparatus comprising:

a plurality of closed processing chambers each provided with an entrance/exit closable opening, a plurality of individual processing chambers being in each of two groups and having an approximately equal configuration in groups and being disposed one above the other in each group, the individual processing chambers having single planes in each case at the same distance from a level on which the apparatus is set up and individual processing chambers having entrance/exit closable openings, a common elevator chamber having a substrate lifting means by which the substrates can be moved vertically from the single plane of one individual processing chamber to another single plane of another individual processing chamber, the entrance/exit closable openings leading all to the common elevator chamber, and at least one of the individual processing chambers of a group, as entrance/exit airlock chamber, being provided with an entrance/exit airlock opening which forms a connection to space surrounding the apparatus.

2. Apparatus according to claim 1, in which one individual processing chamber of one group of individual processing chambers is disposed diametrically opposite the other group of individual processing chambers and is disposed in a plane corresponding to the other group, the entrance/exit closable openings of all individual processing chambers being provided facing one another.

* * * * *